United States Patent
Yosui et al.

(10) Patent No.: US 10,170,836 B2
(45) Date of Patent: Jan. 1, 2019

(54) COIL ANTENNA DEVICE AND ANTENNA MODULE

(71) Applicant: Murata Manufacturing Co., Ltd., Nagaokakyo-shi, Kyoto-fu (JP)

(72) Inventors: Kuniaki Yosui, Nagaokakyo (JP); Noboru Kato, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 457 days.

(21) Appl. No.: 14/190,399

(22) Filed: Feb. 26, 2014

(65) Prior Publication Data

US 2014/0176383 A1 Jun. 26, 2014

Related U.S. Application Data

(63) Continuation of application No. PCT/JP2013/061978, filed on Apr. 24, 2013.

(30) Foreign Application Priority Data

May 9, 2012 (JP) ................................. 2012-107164
Feb. 22, 2013 (JP) ................................. 2013-033101

(51) Int. Cl.
*H01Q 7/08* (2006.01)
*H01F 5/00* (2006.01)
*H01F 17/00* (2006.01)

(52) U.S. Cl.
CPC .............. *H01Q 7/08* (2013.01); *H01F 5/003* (2013.01); *H01F 17/0033* (2013.01)

(58) Field of Classification Search
None
See application file for complete search history.

(56) References Cited

U.S. PATENT DOCUMENTS 6,442,399 B1    8/2002 Tsuru et al.
9,311,590 B2 *  4/2016 Koujima .......... G06K 19/07781
(Continued)

FOREIGN PATENT DOCUMENTS

CN    101208830 A    6/2008
CN    101542832 A    9/2009
(Continued)

OTHER PUBLICATIONS

Official Communication issued in International Patent Application No. PCT/JP2013/061978, dated Jul. 30, 2013.
(Continued)

*Primary Examiner* — Robert Karacsony
(74) *Attorney, Agent, or Firm* — Keating & Bennett, LLP

(57) ABSTRACT

In a coil antenna device, a multilayer structure includes non-magnetic sheets and magnetic sheets stacked on each other. A coil conductor is provided in the multilayer structure such that a portion of the magnetic material defines a magnetic core and such that a coil axis extends along a principle surface of the multilayer structure. The coil conductor includes a plurality of line conductors each of which extends on one principle surface side of the magnetic material, a plurality of line conductors each of which extends on the other principle surface side of the magnetic material, and a plurality of via-hole conductors extending in a thickness direction of the multilayer structure so as to be surrounded with the magnetic material. The plurality of via-hole conductors defines a coiled structure together with the line conductors.

12 Claims, 16 Drawing Sheets

(56) References Cited

U.S. PATENT DOCUMENTS

| | | |
|---|---|---|
| 2005/0179514 A1 | 8/2005 | Yamamoto et al. |
| 2006/0049905 A1 | 3/2006 | Maeda et al. |
| 2008/0129629 A1* | 6/2008 | Kimura ................ H01Q 1/2208 343/788 |
| 2009/0128437 A1* | 5/2009 | Sonoda .................. H01Q 1/362 343/788 |
| 2011/0124299 A1 | 5/2011 | Koujima et al. |
| 2012/0007787 A1* | 1/2012 | Schantz .................... G01S 5/14 343/788 |
| 2012/0071090 A1* | 3/2012 | Charrat ............ G06K 19/07769 455/41.1 |
| 2013/0206845 A1 | 8/2013 | Koujima et al. |
| 2014/0239075 A1 | 8/2014 | Koujima et al. |

FOREIGN PATENT DOCUMENTS

| | | |
|---|---|---|
| CN | 101657938 A | 2/2010 |
| EP | 2 278 661 A1 | 1/2011 |
| GB | 2461443 A | 1/2010 |
| JP | 06-112655 A | 4/1994 |
| JP | 2003-218626 A | 7/2003 |
| JP | 2004-193512 A | 7/2004 |
| JP | 2009-284476 A | 12/2009 |
| JP | 2010-259068 A | 11/2010 |
| JP | 2012-39242 A | 2/2012 |
| WO | WO2012017921 * | 2/2012 |

OTHER PUBLICATIONS

Official Communication issued in corresponding Chinese Patent Application No. 201380001868.7, dated Oct. 28, 2014.
Official Communication issued in corresponding United Kingdom Patent Application No. 1400713.2, dated Mar. 20, 2017.

\* cited by examiner

COIL ANTENNA DEVICE AND ANTENNA MODULE

BACKGROUND OF THE INVENTION

1. Field of the Invention

The present invention relates to a coil antenna device, and more particularly to a coil antenna device that includes a core including a magnetic layer and a coil conductor arranged in the core such that a portion of the magnetic layer defines a magnetic core and such that a coil axis extends along a principle surface of the core.

2. Description of the Related Art

The present invention also relates to an antenna module in which a plurality of wireless communication devices for use in wireless communication, which includes a coil antenna device, is mounted on a printed wiring board.

An example of such coil antenna devices is disclosed in Japanese Unexamined Patent Application Publication No. 2009-284476. According to this background art, a magnetic antenna is formed such that an electrode material is arranged in a coil shape around a center core composed of a magnetic material and a non-magnetic material. Further, an insulation layer is formed on one or both of exterior side surfaces of the coiled electrode material. Further, a cross-section of the core, which is cut in a direction perpendicular to a magnetic flux, is configured such that the magnetic material is divided by the non-magnetic material. According to the foregoing configuration, reduction in size and improvement in communication sensitivity are achieved together.

Here, the "coil antenna" is a device that wirelessly communicates with an antenna of a communicating party on the other side through a magnetic field produced in a coil conductor. As frequencies of wireless signals, HF bands are mostly used.

However, in the background art, the coiled electrode material is wound on the surface of the core, thereby producing a magnetic field that expands evenly in the core's side surface directions and principle surface directions. This may cause magnetic field formation failures due to interference between a metal object mounted near the magnetic antenna and the magnetic field, and thus lead to deterioration in wireless communication performance. It is particularly worrying that sufficient communication distance may not be secured, or that communication characteristics may vary when the mounting position of the metal object is changed.

SUMMARY OF THE INVENTION

Accordingly, preferred embodiments of the present invention provide a coil antenna device and an antenna module that are capable of significantly reducing or preventing deterioration in wireless communication performance.

A coil antenna device according to a preferred embodiment of the present invention includes a core including a magnetic layer; and a coil conductor arranged in the core such that a portion of the magnetic layer defines a magnetic core and such that a coil axis extends along a principle surface of the core. The coil conductor includes a line conductor portion that extends along a principle surface of the core and a plurality of via-hole conductor portions extending in a thickness direction of the core so as to be surrounded by the magnetic layer. Further, at least a portion of the line conductor portion is disposed outside of the magnetic layer.

Preferably, the line conductor portion includes a plurality of first line conductors and a plurality of second line conductors. Each of the plurality of first line conductors extend on one principle surface side of the magnetic layer, and each of the plurality of second line conductors extend on another principle surface side of the magnetic layer. Further, the plurality of via-hole conductors preferably define a coiled structure together with the plurality of first line conductors and the plurality of second line conductors.

According to another preferred embodiment of the present invention, the core further includes a first low magnetic permeability layer that has a magnetic permeability lower than that of the magnetic layer, that is stacked on one principle surface side of the magnetic layer, and that supports at least one of the plurality of first line conductors at a position detached from the magnetic layer.

More preferably, each of the plurality of first line conductors include a plurality of first partial line conductors that are connected in parallel to each other with the via-hole conductor portion, and at least one of the plurality of first partial line conductors is supported by the first low magnetic permeability layer.

Each of the plurality of first partial line conductors preferably include a line width that becomes wider as a distance from the magnetic layer increases. Further, the plurality of first partial line conductors are arranged such that the respective first partial line conductors are disposed at positions different from each other when viewed from a stacking direction.

According to another preferred embodiment of the present invention, the core further includes a second low magnetic permeability layer that has a magnetic permeability lower than that of the magnetic layer, that is stacked on another principle surface side of the magnetic layer, and that supports at least one of the plurality of second line conductors at a position detached from the magnetic layer.

More preferably, each of the plurality of second line conductors preferably includes a plurality of second partial line conductors that are connected in parallel to each other with the via-hole conductor portion, and at least one of the plurality of second partial line conductors preferably is supported by the second low magnetic permeability layer.

According to another preferred embodiment of the present invention, each of the plurality of first line conductors preferably extend in a first direction. The first direction intersects with a predetermined side surface at a first angle, and the predetermined side surface is one of a plurality of side surfaces that define the core and intersect with the coil axis. Further, each of the plurality of second line conductors extend in a second direction. The second direction intersect with the predetermined side surface at a second angle, and the second angle is larger than the first angle.

More preferably, the coil antenna device preferably further includes a plurality of terminals that is provided on another principle surface side of the magnetic layer and respectively connected to both ends of the coil conductor. Of the plurality of first line conductors, two conductors define the two end portions of the coil conductor.

Preferably, the core further includes a mounting layer that is stacked on one principle surface side of the magnetic layer and on which a wireless communication device that operates jointly with the coil conductor is mounted. The wireless communication device is connected to the coil conductor by the via-hole conductor portion.

An antenna module according to another preferred embodiment of the present invention is an antenna module in which a plurality of wireless communication devices, which includes a coil antenna device, for use in wireless communication is mounted on a printed wiring board. The coil antenna device includes a core including a magnetic layer, and a coil conductor arranged in the core such that a portion of the magnetic layer defines a magnetic core and such that a coil axis extends along a principle surface of the core. The coil conductor includes a line conductor portion that extends along a principle surface of the core and a plurality of via-hole conductor portions that extend in a thickness direction of the core so as to be surrounded by the magnetic layer. Further, at least a portion of the line conductor portion is be disposed outside of the magnetic layer.

Preferably, a principle surface of the printed wiring board has a rectangular or substantially rectangular shape and includes a predetermined corner portion, and the coil antenna device is mounted near the predetermined corner such that the coil axis intersects with two straight lines that define the predetermined corner portion.

Preferably, the plurality of wireless communication devices include an inductance device or a capacitance device or both, which are mounted on the printed wiring board so as not to intersect with the coil axis.

Preferably, the plurality of wireless communication devices include an inductance device mounted on the printed wiring board so as to intersect with the coil axis.

According to various preferred embodiments of the present invention, the plurality of via-hole conductor portions, which define the coil conductor, extend in the thickness direction of the core so as to be surrounded by the magnetic layer. Thus, the magnetic field that emerges above the side surfaces of the core is significantly reduced or prevented. As a result, it becomes possible to prevent magnetic field formation failure due to interference between the magnetic object mounted near the coil antenna device and the magnetic field that emerges above the side surfaces of the core, such that wireless communication performance is maintained.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
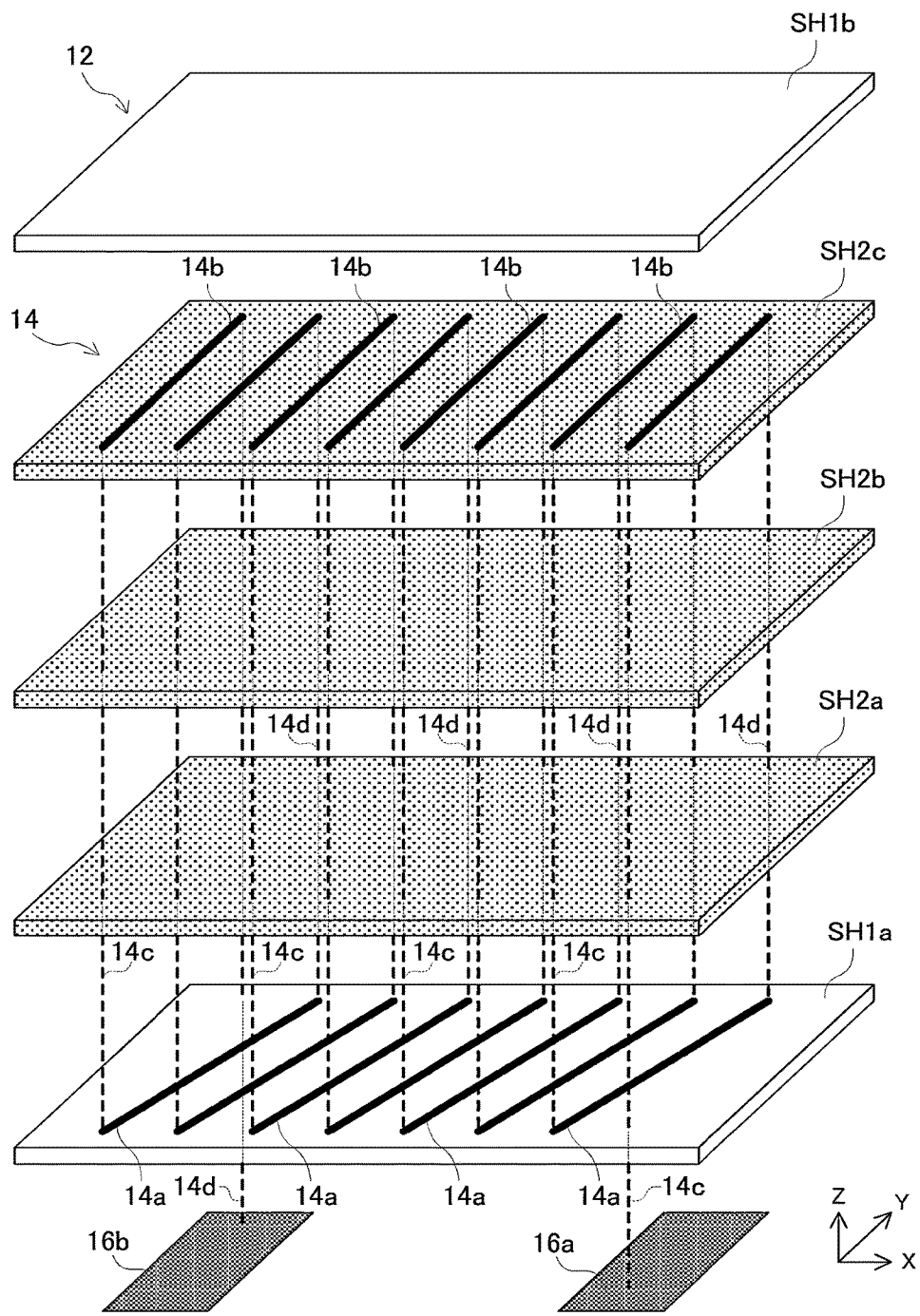
FIG. 1 is a schematic view illustrating a breakdown of a coil antenna device according to a preferred embodiment of the present invention.
Figure 2:
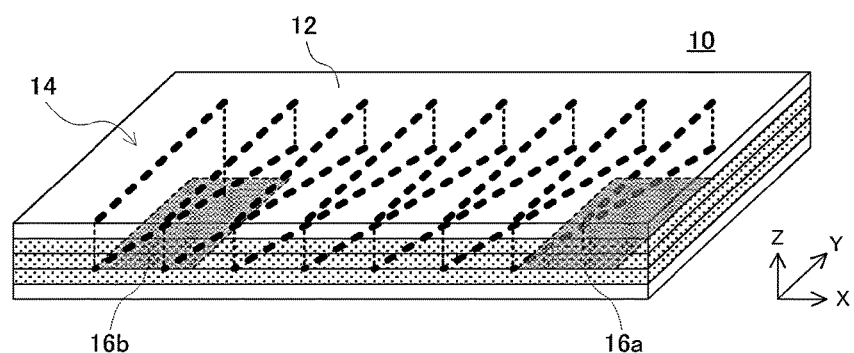
FIG. 2 is a perspective view illustrating an exterior appearance of a coil antenna device according to a preferred embodiment of the present invention.

Referring to FIG. 1 and FIG. 2, a coil antenna device according to a preferred embodiment includes a flat multilayer structure 12 in which non-magnetic sheets SH1a, SH1b and magnetic sheets SH2a, SH2b, SH2c are stacked on top of each other. Each of the non-magnetic sheets SH1a, SH1b and the magnetic sheets SH2a, SH2b, SH2c preferably has a rectangular or substantially rectangular top surface or a rectangular or substantially rectangular bottom surface. More specifically, the magnetic sheets SH2a, SH2b, and SH2c are sequentially stacked on the non-magnetic sheet SH1a in order of description, and further the non-magnetic sheet SH1b is stacked on the magnetic sheet SH2c. A longer side and a shorter side of the rectangular or substantially rectangular shape that defines the top surface or the bottom surface of the multilayer structure 12 extend along X axis and Y axis, respectively, and a thickness of the multilayer structure 12 increases along Z axis. Here, the "multilayer structure" has the same meaning as a "core".

A plurality of line conductors 14a is provided on the top surface of the non-magnetic sheet SH1a, and a plurality of line conductors 14b is provided on the top surface of the magnetic sheet SH2c. The plurality of line conductors 14a is arranged such that the line conductors 14a are lined up in a X axis direction with an equal interval between them and respectively positioned so as to extend in a common direction. Similarly, the plurality of line conductors 14b is arranged such that the line conductors 14b are lined up in the X axis direction with an equal interval between them and respectively positioned so as to extend in a common direction.

Each of the plurality of line conductors 14a includes two end portions that are disposed between two Y axis direction edges of the bottom surface of the magnetic sheet SH2a. Further, of the plurality of line conductors 14a, two line conductors 14a at both sides in the X axis direction are disposed between two X axis direction edges of the bottom surface of the magnetic sheet SH2a.

Further, each of the plurality of line conductors 14b includes two end portions that are disposed between two Y axis direction edges of the top surface of the magnetic sheet SH2c. Further, of the plurality of line conductors 14b, two line conductors 14b and 14b at both sides in the X axis direction are disposed between two X axis direction edges of the top surface of the magnetic sheet SH2c.

However, the extending direction of the line conductor 14b is parallel or substantially parallel to the Y axis direction whereas the extending direction of the line conductor 14a is oblique to the Y axis direction. In other words, the line conductor 14b extends at an angle of zero degrees to the Y axis whereas the line conductor 14a extends at an angle larger than zero degrees to the Y axis. Further, the length in the X axis direction from one end to the other end of the line conductor 14a is equal or substantially equal to the gap between two adjacent line conductors 14b and 14b. Still further, one end of any line conductor 14b and the other end of another line conductor 14b are present directly above one end and the other end of any line conductor 14a, respectively. Further, the number of the line conductors 14a is one less than the number of the line conductors 14b.

The multilayer structure 12 is also provided with a plurality of via-hole conductors 14c that penetrate through the magnetic sheets SH2a, SH2b, and SH2c in the Z axis direction so as to connect first ends of the line conductors 14a and first ends of the line conductors 14b. Further, the multilayer structure 12 is provided with a plurality of via-hole conductors 14d that penetrate through the magnetic sheets SH2a, SH2b, and SH2c in the Z axis direction so as to connect second ends of the line conductors 14a and second ends of the line conductor 14b.

Since the spatial relationship between the two ends of the line conductor 14a and the two ends of the line conductor 14b are as described above, the via-hole conductors 14c and 14d are surrounded with the magnetic material, and the line conductors 14a, 14b define a coiled structure (coil conductor 14) together with the via-hole conductors 14c, 14d. A coil antenna includes the magnetic material inside the coiled structure, the line conductors 14a, 14b, and the via-hole conductors 14c, 14d.

A conductive terminal 16a is located on the bottom surface of the multilayer structure 12 at a position near the positive side edge of the multilayer structure 12 in the X axis direction, and a conductive terminal 16b is located on the bottom surface of the multilayer structure 12 at a position near the negative side edge of the multilayer structure 12 in the X axis direction. The via-hole conductor 14c that defines one end portion of the coil conductor 14 further penetrates the non-magnetic sheet SH1a and is connected to the conductive terminal 16a. Further, the via-hole conductor 14d that defines the other end portion of the coil conductor 14 further penetrates the non-magnetic sheet SH1a and is connected to the conductive terminal 16b.

Figure 3:
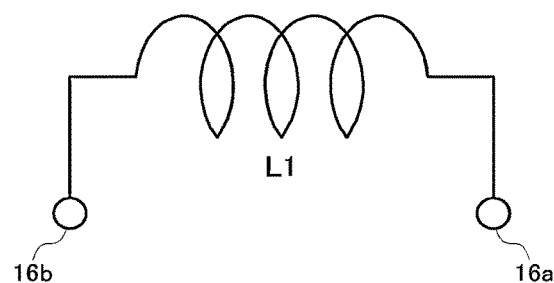
FIG. 3 is an equivalent circuit diagram illustrating a configuration of a coil antenna device according to a preferred embodiment of the present invention.

An equivalent circuit of the coil antenna device 10 that is fabricated as described above is configured as illustrated in FIG. 3. As illustrated in FIG. 3, one end of an inductor L1 is connected to the conductive terminal 16a, and the other end of the inductor L1 is connected to the conductive terminal 16b.

Figure 4:
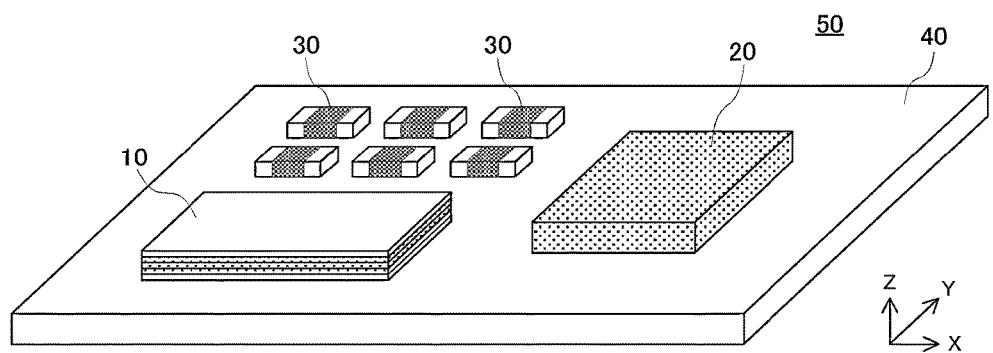
FIG. 4 is a perspective view illustrating an antenna module according to a preferred embodiment of the present invention.
Figure 5A:
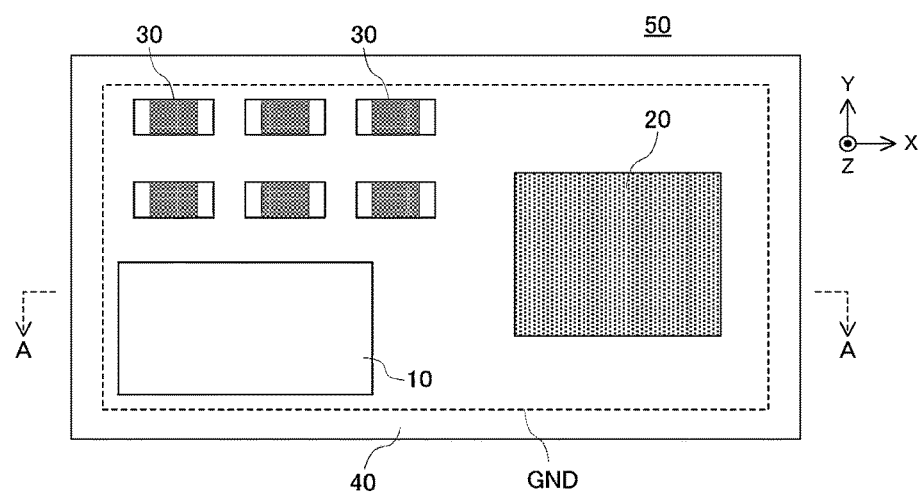
FIG. 5A is a plan view illustrating an antenna module according to a preferred embodiment of the present invention.
Figure 5B:
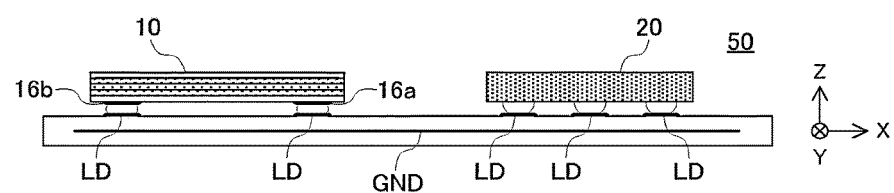
FIG. 5B is a cross-sectional view of the antenna module illustrated in FIG. 5A taken along line A-A.

Referring to FIG. 4, FIG. 5A, and FIG. 5B, the coil antenna device 10 is mounted on a printed wiring board 40 such that a coil axis of the coil conductor 14 is positioned along a principle surface of the printed wiring board 40. The printed wiring board 40 defines a portion of an antenna module 50. On the printed wiring board 40, a RFIC device 20 that performs wireless signal processing is mounted. Further, a plurality of passive devices 30, each of which has an inductance and/or a capacitance, is mounted thereon. The printed wiring board 40 includes a rectangular or substantially rectangular top surface and a rectangular or substantially rectangular bottom surface. Wiring conductors LD are located on that top surface, and a ground layer GND is buried inside the printed wiring board 40 so as to cover substantially the whole area thereof.

The conductive terminals 16a and 16b provided in the coil antenna device 10 are connected to the wiring conductors LD with solder paste. Similarly, the passive devices 30 are connected to the wiring conductors LD with solder paste. On the other hand, the RFIC device 20 that performs wireless signal processing is connected to the wiring conductors LD through solder bumps located on a bottom surface of the RFIC device 20.

The ground layer GND includes a rectangular or substantially rectangular top surface and a rectangular or substantially rectangular bottom surface. The longer side length and the shorter side length of that rectangular or substantially rectangular shape are respectively shorter than the longer side length and the shorter side length of the rectangular or substantially rectangular shape that defines the top surface or the bottom surface of the printed wiring board 40. Further, the ground layer GND is buried inside the printed wiring board 40 in such a way that the top surface and the bottom surface of the ground layer GND are parallel or substantially parallel to the top surface and the bottom surface of the printed wiring board 40, and that the longer side and the shorter side of the rectangular or substantially rectangular shape that defines the top surface or the bottom surface of the ground layer GND extend parallel or substantially parallel to the longer side and the shorter side of the rectangular or substantially rectangular shape that defines the top surface or the bottom surface of the printed wiring board 40.

The coil antenna device 10 is mounted on the printed wiring board 40 at a position that is located on the negative side of the X axis direction and the negative side of the Y axis direction, relative to the center of the top surface of the printed wiring board 40. Further, the coil antenna device 10 is mounted on the printed wiring board 40 such that the longer side of the rectangular or substantially rectangular shape that forms the top surface or the bottom surface of the multilayer structure 12 extends parallel or substantially parallel to the longer side of the rectangular or substantially rectangular shape that defines the top surface or the bottom surface of the ground layer GND. However, when viewed from the Z axis direction, the rectangular or substantially rectangular shape that defines the top surface or the bottom surface of the multilayer structure 12 stays inside the rectangular or substantially rectangular shape that defines the top surface or the bottom surface of the ground layer GND.

Figure 6:
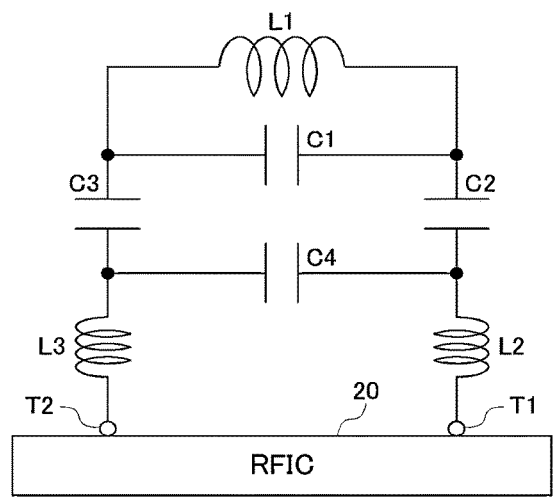
FIG. 6 is an equivalent circuit diagram illustrating a configuration of an antenna module according to a preferred embodiment of the present invention.

An equivalent circuit of the antenna module 50 that is fabricated as described above is configured as illustrated in FIG. 6. As illustrated in FIG. 6, one end of the inductor L1 is connected to a terminal T1 of the RFIC 20 through a capacitor C2 and an inductor L2, and the other end of the inductor L1 is connected to a terminal T2 of the RFIC 20 through a capacitor C3 and an inductor L3. Further, one end of a capacitor C1 is connected to a connecting point of the inductor L1 and the capacitor C2, and the other end of the capacitor C1 is connected to a connecting point of the inductor L1 and the capacitor C3.

Still further, one end of a capacitor C4 is connected to a connecting point of the inductor L2 and the capacitor C2, and the other end of the capacitor C4 is connected to a connecting point of the inductor L3 and the capacitor C3. Here, the inductors L2, L3 and the capacitor C4 define a filter circuit, and the capacitors C1, C2, and C3 define a matching circuit. The inductors L1 to L3 and the capacitors C1 to C4 preferably are respectively defined by chip-shaped passive devices 30.

As described above, the coil conductor 14 of the coil antenna device 10 is arranged in the multilayer structure 12 in such a way that the portion of the magnetic material of the coil conductor 14 defines a magnetic core and that the coil axis is positioned along a principle surface of the multilayer structure 12. Further, the via-hole conductors 14c and 14d, which define portions of the coil conductor 14, extend in a thickness direction of the multilayer structure 12 so as to be surrounded by the magnetic material.

Figure 7A:
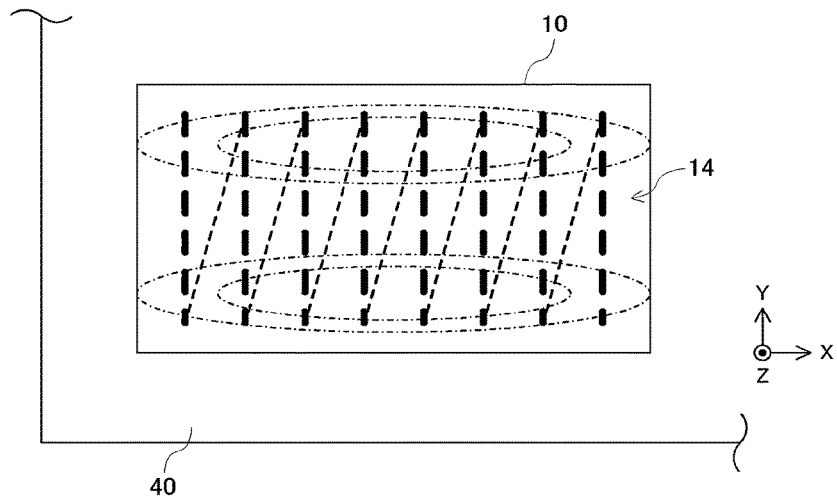
FIG. 7A is a schematic view illustrating a portion of a magnetic field produced by an coil antenna device.
Figure 7B:
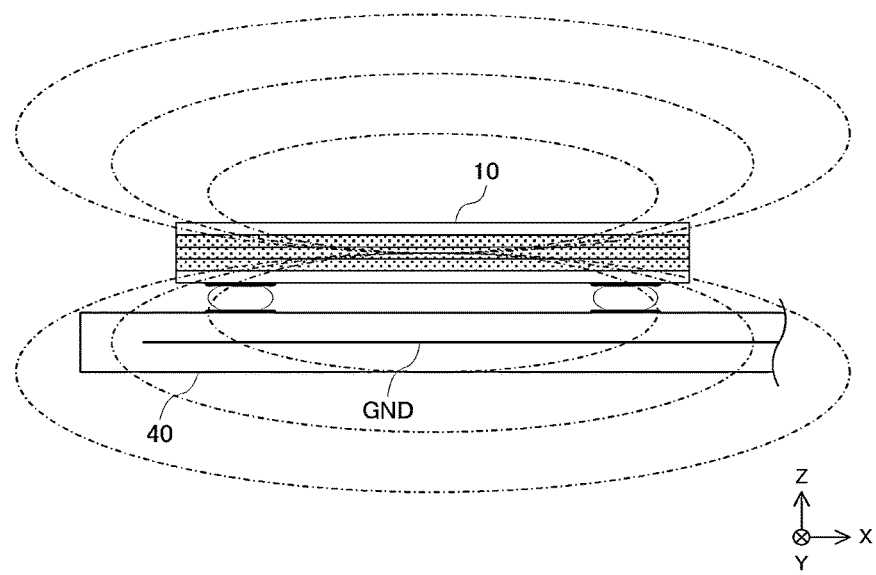
FIG. 7B is a schematic view illustrating another portion of the magnetic field produced by the coil antenna device.

Accordingly, as illustrated in FIG. 7A and FIG. 7B, the magnetic field produced by the coil conductor 14 greatly expands outward toward the X axis direction and the Z axis direction while being confined inside the multilayer structure 12 in the Y axis direction. In other words, the magnetic field that emerges above the side surfaces of the multilayer structure facing the Y axis direction is greatly suppressed. As a result, it is possible to prevent magnetic field formation failure due to interference between the passive devices 30 mounted near the coil antenna device 10 and the magnetic field produced by the coil conductor 14, and desired wireless communication performance is maintained. Particularly, this advantageous effect becomes prominent when the passive device 30 includes a magnetic chip component.

Further, the coil antenna device 10 is mounted at such a position that the rectangular or substantially rectangular shape defining the top surface or the bottom surface of the multilayer structure 12 stays inside the rectangular or substantially rectangular shape defining the top surface or the bottom surface of the ground layer GND, and positioned such that the longer side of the rectangular or substantially rectangular shape defining the top surface or the bottom surface of the multilayer structure 12 extends parallel or substantially parallel to the longer side of the rectangular or substantially rectangular shape defining the top surface or the bottom surface of the ground layer GND.

Accordingly, the plurality of line conductors 14a disposed on the bottom side of the magnetic material extends in an oblique direction with respect to the shorter side of the rectangular or substantially rectangular shape that defines the top surface or the bottom surface of the ground layer GND whereas the plurality of line conductors 14b disposed on the upper side of the magnetic material extends parallel or substantially parallel to the shorter side of the rectangular or substantially rectangular shape that defines the top surface or the bottom surface of the ground layer GND. Further, of the plurality of line conductors 14b disposed on the top side of the magnetic material, two line conductors 14b positioned at both X axis direction ends are connected to the conductive terminals 16a and 16b provided on the bottom surface of the multilayer structure 12.

Figure 8A:
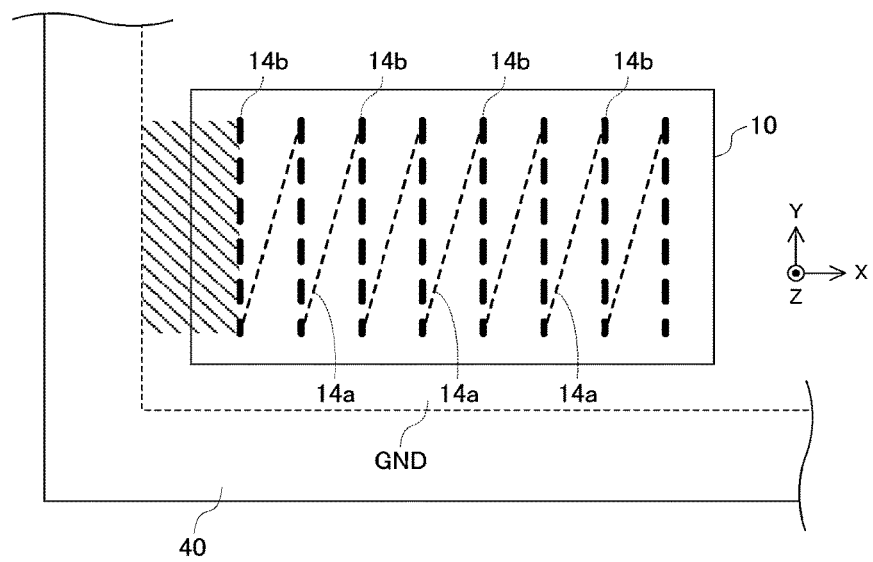
FIG. 8A is a schematic view illustrating an example of a region where an eddy current is induced by a magnetic field that is produced by a coil antenna device.
Figure 8B:
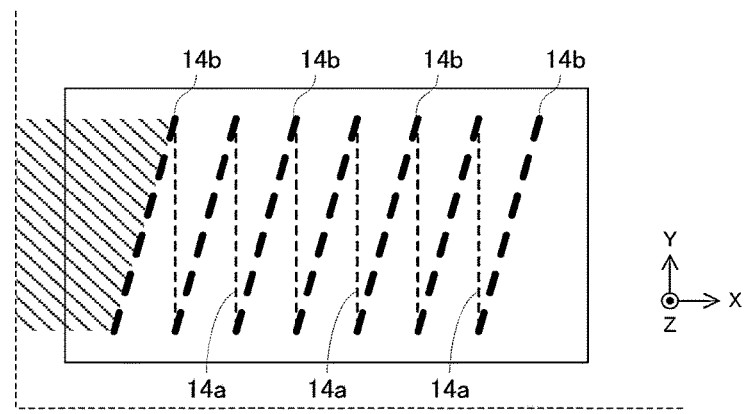
FIG. 8B is a reference view for size comparison with the region where an eddy current is induced.

Thus, an eddy current is induced at a hatched region illustrated in FIG. 8A at an end portion of the coil conductor 14 on the negative side of the X axis direction. However, the area of this hatched region is narrower compared with the area (see FIG. 8B) in the case where the line conductors 14b are extended in the oblique direction with respect to the shorter side of the ground layer GND and the line conductors 14a are extended parallel or substantially parallel to the shorter side of the ground layer GND. As a result, a loss due to the induction of eddy current is significantly reduced or prevented.

Figure 9:
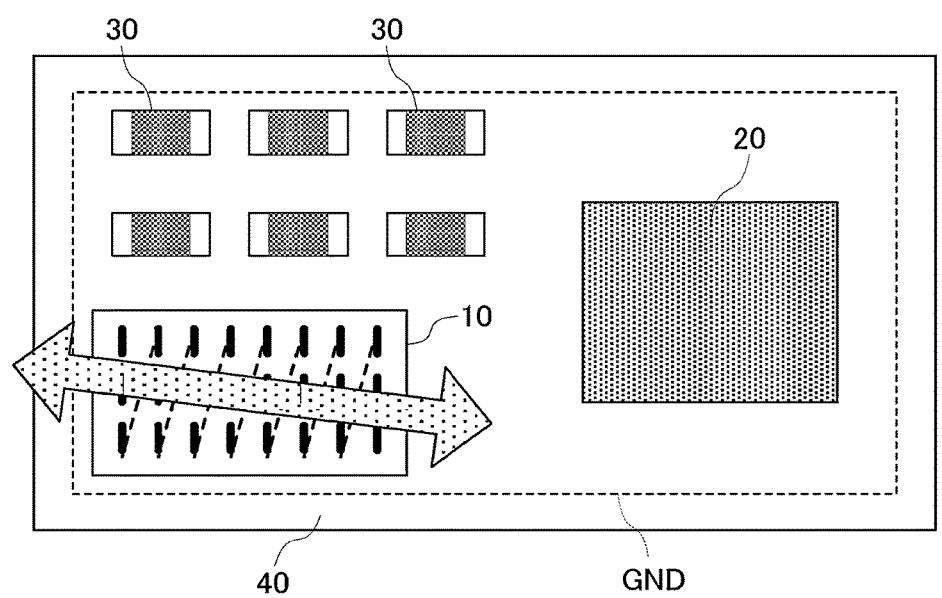
FIG. 9 is a schematic view illustrating an example of spatial relationship between a coil antenna device and a printed wiring board.

Further, since the arrangement of the coil antenna device 10 and length directions of the line conductors 14a, 14b are as described above, the coil axis of the coil conductor 14 crosses two straight lines that define a predetermined corner portion (the corner portion on the negative side of the X axis direction and the negative side of the Y axis direction) of the rectangular or substantially rectangular shape that defines the top surface or the bottom surface of the printed wiring board 40 (see the arrow symbol in FIG. 9). This makes it possible to avoid situations where the passive devices 30 and the RFIC device 20 that perform wireless signal processing disturb the magnetic field formation in the coil antenna device 10.

In this preferred embodiment, non-magnetic sheets preferably are used as the sheets SH1a and SH1b whereas magnetic sheets preferably are used as the sheets SH2a, SH2b, and SH2c. However, magnetic sheets may be used as the sheets SH2a and SH2c, or a magnetic sheet may be used as the sheet SH1a. Further, a sheet having a magnetic permeability less than that of the magnetic sheet may be used in place of the non-magnetic sheet.

Figure 10:
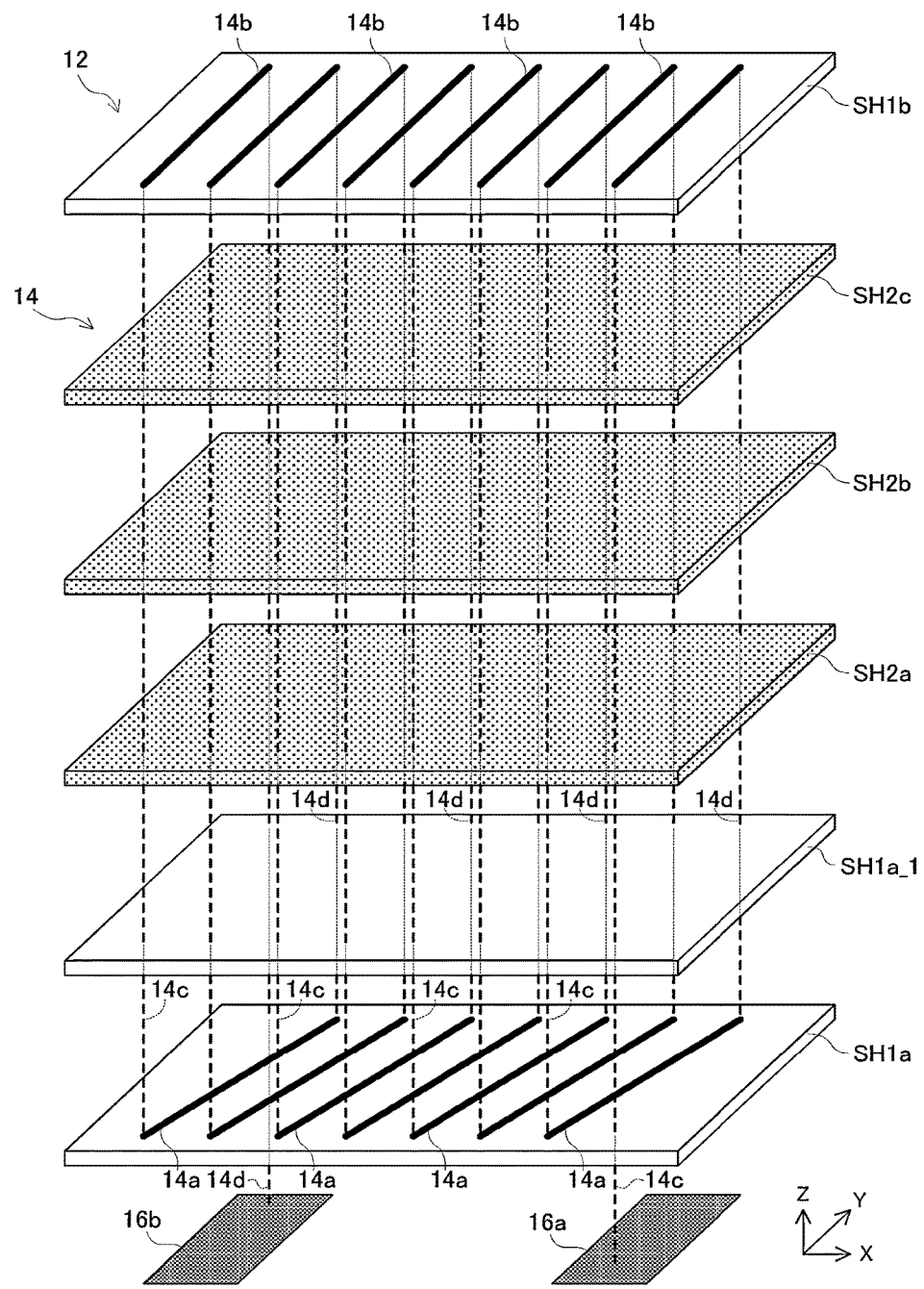
FIG. 10 is a schematic view illustrating a breakdown of a coil antenna device according to another preferred embodiment of the present invention.

Referring to FIG. 10, a coil antenna device 10 according to another preferred embodiment is similar to the coil antenna device 10 illustrated in FIG. 1 except that an additional non-magnetic sheet SH1a_1 is stacked between the non-magnetic sheet SH1a and the magnetic sheet SH2a, that the line conductors 14b are located on the top surface of the non-magnetic sheet SH1b instead of the magnetic sheet SH2c, and that the via-hole conductors 14c and 14d further penetrate the non-magnetic sheets SH1a_1 and SH1b.

According to the present preferred embodiment, the line conductors 14a are supported with the non-magnetic sheets SH1a and SH1a_1 so as to be detached from the bottom surface of the magnetic sheet SH2a. Similarly, the line conductors 14b are also supported by the non-magnetic sheets SH1b so as to be detached from the top surface of the magnetic sheet SH2c. The line conductors 14a and 14b are surrounded by the non-magnetic material, and this improves radiation characteristics of the magnetic field (i.e., communication range).

Figure 11:
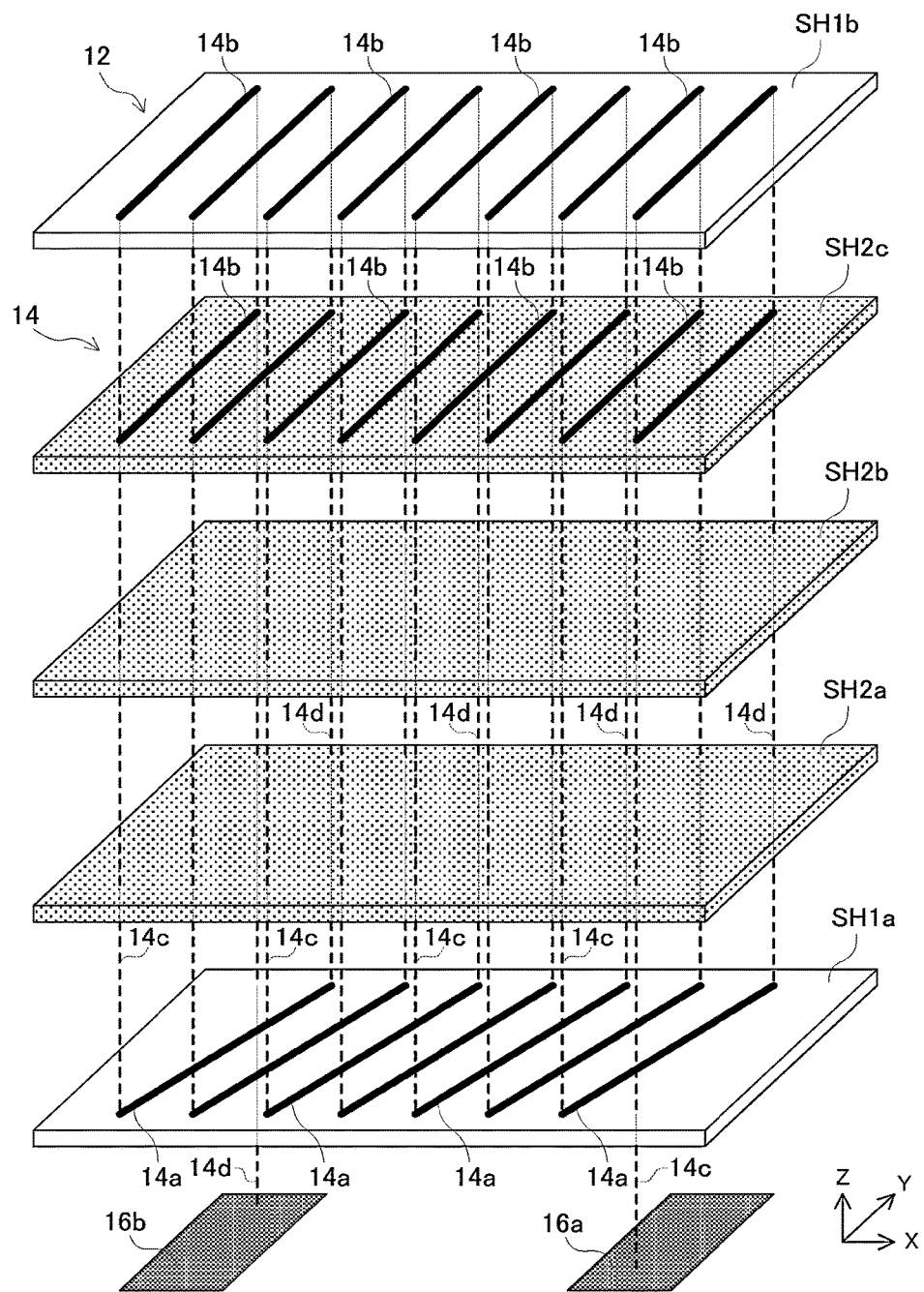
FIG. 11 is a schematic view illustrating a breakdown of a coil antenna device according to still another preferred embodiment of the present invention.
Figure 12:
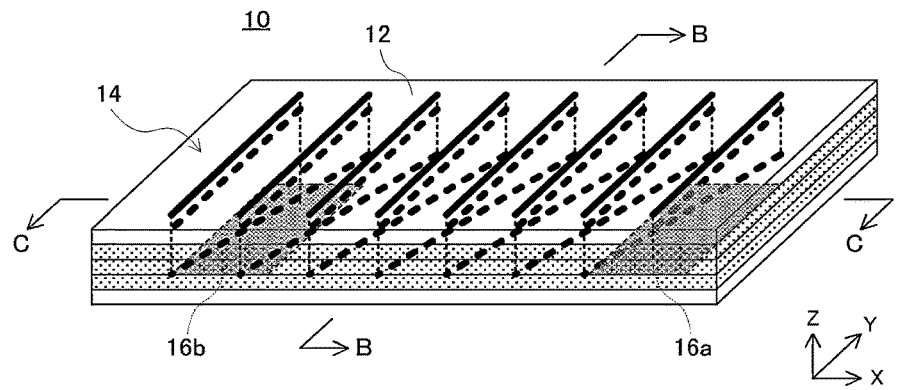
FIG. 12 is a perspective view illustrating an exterior appearance of the coil antenna device illustrated in FIG. 11.

Referring to FIG. 11 and FIG. 12, a coil antenna device 10 according to still another preferred embodiment is similar to the antenna coil device 10 illustrated in FIG. 1 except that the line conductors 14b are located on the top surface of the non-magnetic sheet SH1b in addition to the top surface of the magnetic sheet SH2c, and that the via-hole conductors 14c and 14d further penetrate the non-magnetic sheet SH1b.

Figure 13A:
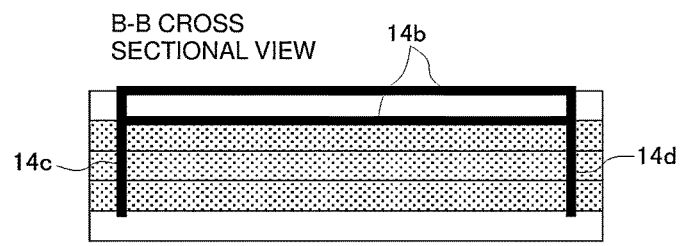
FIG. 13A is a cross-sectional view of the coil antenna device illustrated in FIG. 12 taken along line B-B.
Figure 13B:
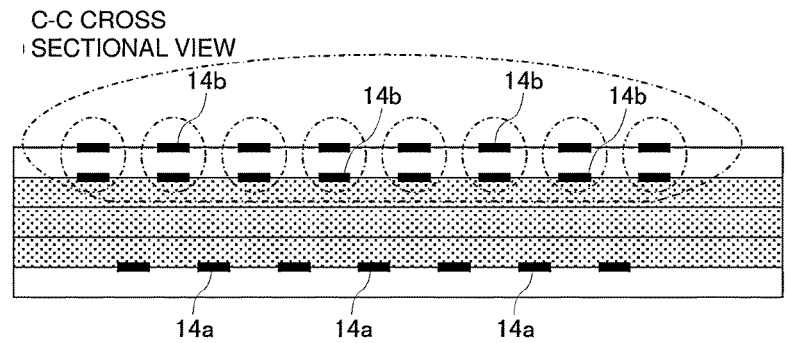
FIG. 13B is a cross-sectional view of the coil antenna device illustrated in FIG. 12 taken along line C-C.

The B-B cross section of the multilayer structure 12 is configured as illustrated in FIG. 13A. In other words, two line conductors 14*b* and 14*b*, which overlap each other when they are viewed in the Z axis direction, are connected in parallel to each other by the via-hole conductors 14*c* and 14*d*. This reduces the series resistance (conductor loss) of the coil conductor 14 and improves antenna characteristics. Further, the C-C cross section of the multilayer structure 12 is configured as illustrated in FIG. 13B. The line conductors 14*b* are arranged in close proximity. Thus, the magnetic fields produced by the respective line conductors 14*b* are added together, making magnetic field loops grow larger. As a result, by making the line conductors 14*b* on the non-magnetic sheet SH1*b* detach from the magnetic sheet SH2*c*, the radiation characteristics of the magnetic field are further improved.

Further, in the present preferred embodiment, the non-magnetic sheet SH1*a*_1 preferably is also added to detach the line conductors 14*a* from the bottom surface of the magnetic sheet SH2*a*.

Figure 14:
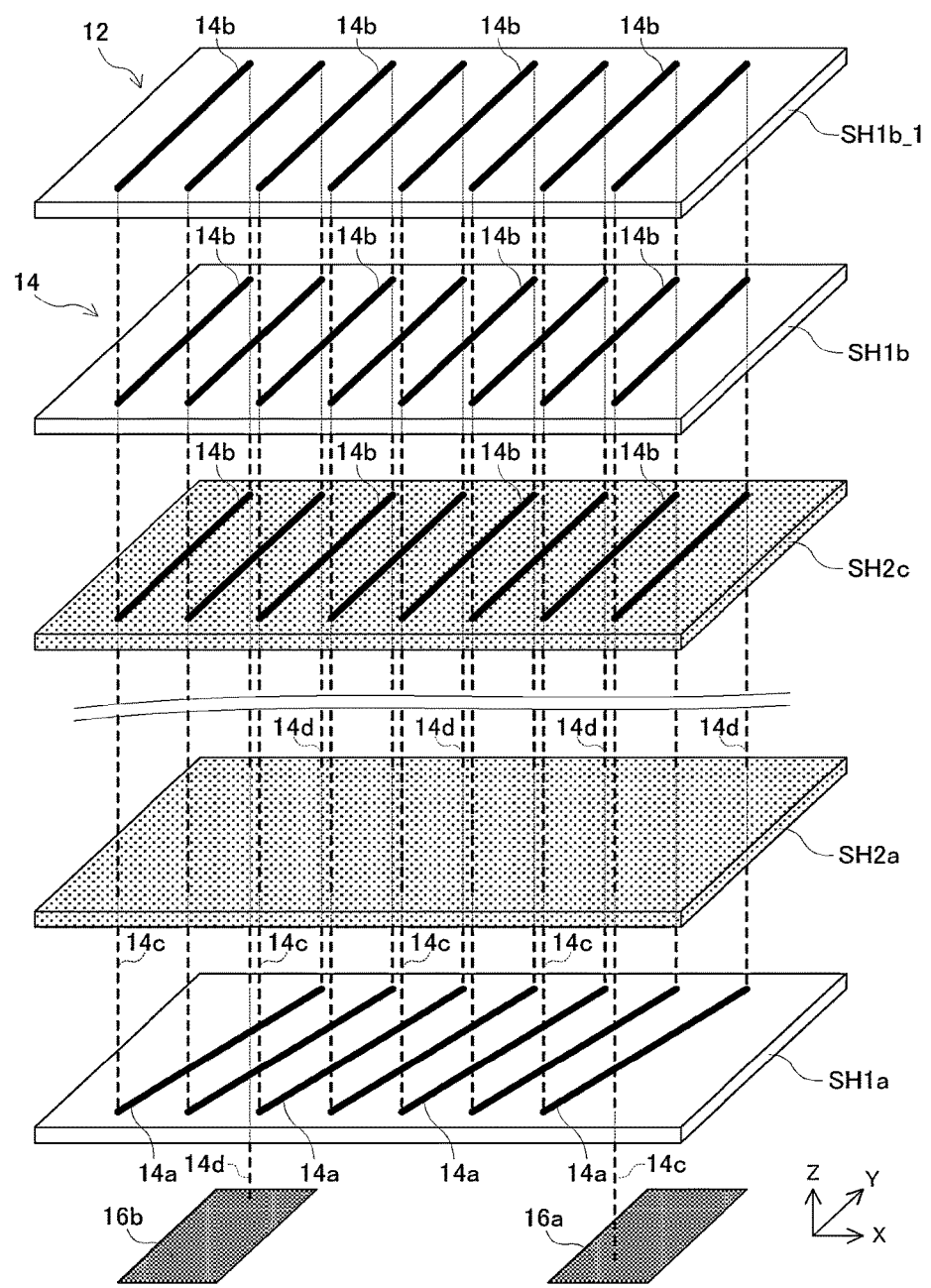
FIG. 14 is a schematic view illustrating a breakdown of a coil antenna device according to another preferred embodiment of the present invention.

Referring to FIG. 14, a coil antenna device 10 according to still another preferred embodiment is similar to the coil antenna device 10 illustrated in FIG. 11 except that an additional non-magnetic sheet SH1*b*_1, on the top surface of which the line conductors 14*b* are located, is stacked on the non-magnetic sheet SH1*b*, and that the via-hole conductors 14*c* and 14*d* further penetrate the non-magnetic sheet SH1*b*_1 in addition to the non-magnetic sheet SH1*b* in the Z axis direction. Three line conductors 14*b*, which overlap each other when they are viewed in the Z axis direction, are connected in parallel to each other with the via-hole conductors 14*c* and 14*d*. This further improves the radiation characteristics of magnetic field.

In the present preferred embodiment, the non-magnetic sheet SH1*a*_1 preferably is also added to detach the line conductors 14*a* from the bottom surface of the magnetic sheet SH2*a*.

Figure 15:
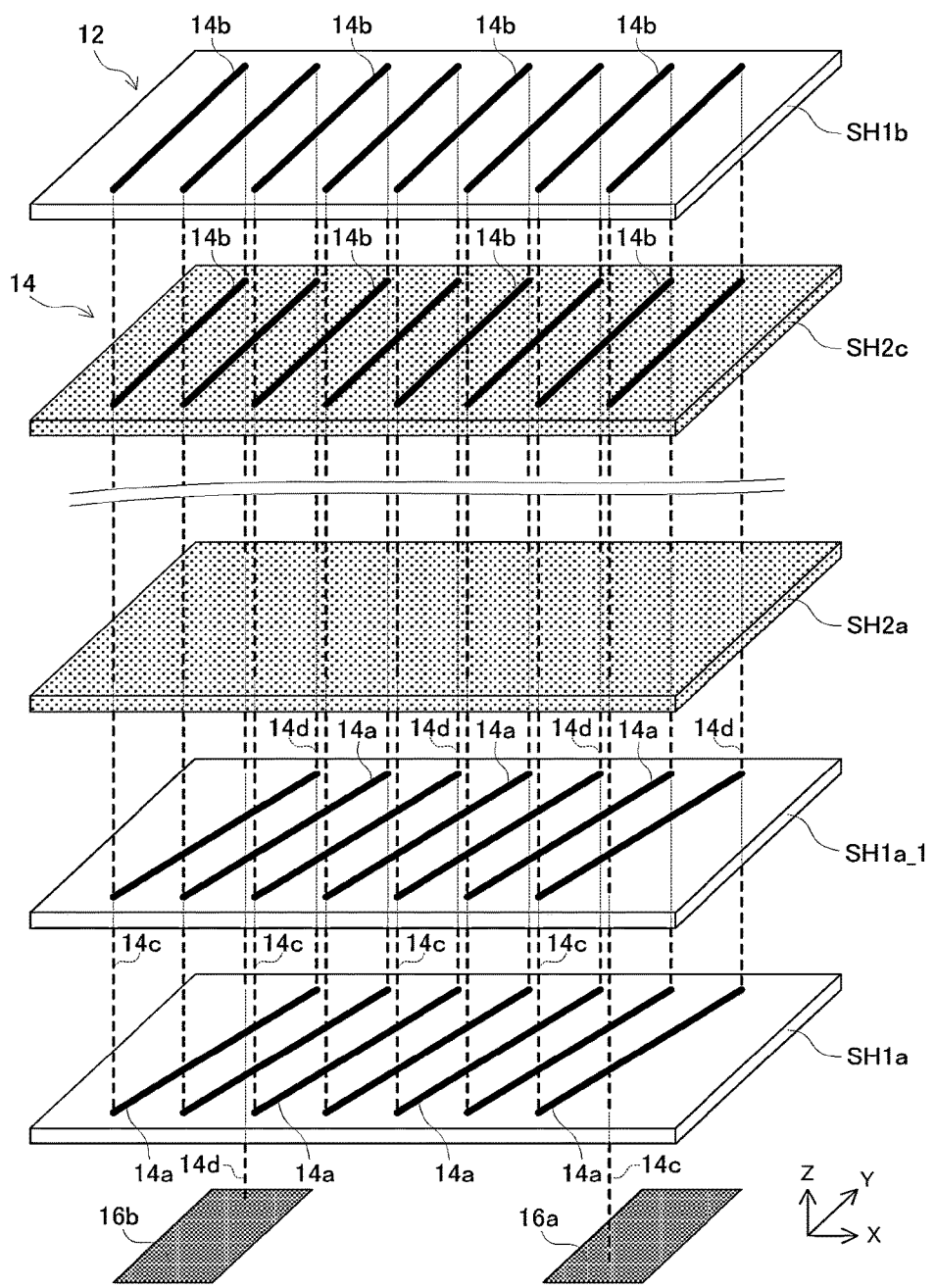
FIG. 15 is a schematic view illustrating a breakdown of a coil antenna device according to another preferred embodiment of the present invention.

Referring to FIG. 15, a coil antenna device 10 according to another preferred embodiment is similar to the antenna coil device 10 illustrated in FIG. 11 except that an additional non-magnetic sheet SH1*a*_1, on the top surface of which the line conductors 14*a* are located, is stacked between the non-magnetic sheet SH1*a* and the magnetic sheet SH2*a*, and that the via-hole conductors 14*c* and 14*d* further penetrate the non-magnetic sheet SH1*a*_1. According to the present preferred embodiment, two line conductors 14*a*, which overlap each other when they are viewed in the Z axis direction, are connected in parallel to each other with the via-hole conductors 14*c* and 14*d*. Such a configuration also improves the radiation characteristics of magnetic field.

Figure 16:
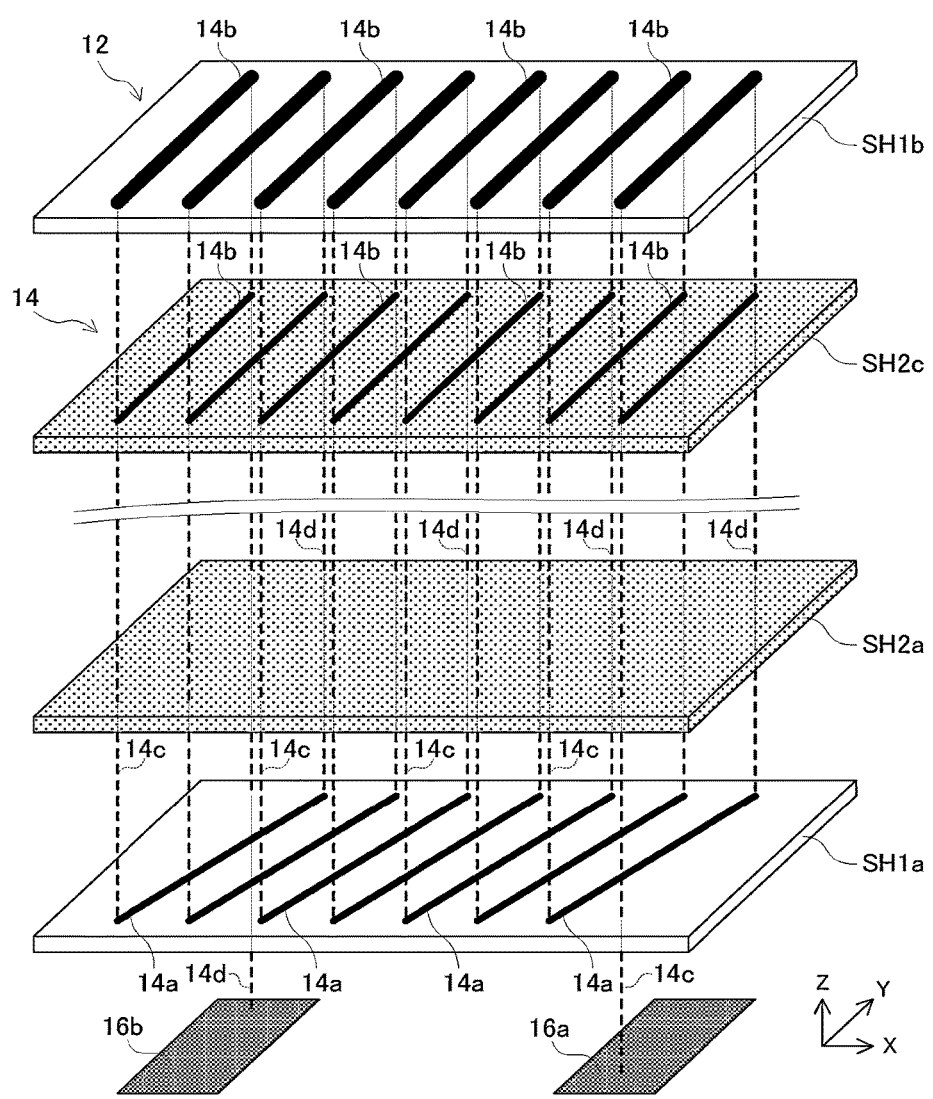
FIG. 16 is a schematic view illustrating a breakdown of a coil antenna device according to another preferred embodiment of the present invention.

Referring to FIG. 16, a coil antenna device 10 according to still another preferred embodiment is similar to the coil antenna device 10 illustrated in FIG. 11 except that line widths of the line conductors 14*b* located on the non-magnetic sheet SH1*b* are wider than line widths of the line conductors 14*b* located on the magnetic sheet SH2*c*. In the present preferred embodiment, the line width of the line conductor 14*b* becomes wider as the distance from the top surface of the magnetic sheet SH2*c* increases. In other words, when viewed from the positive side of the Z axis, the line conductors 14*b* located on the top surface of the magnetic sheet SH2*c* are covered with the line conductors 14*b* located on the top surface of the non-magnetic sheet SH1*b*. This further reduces the series resistance (conductor loss) of the coil conductor 14 and further improves the radiation characteristics.

In the present preferred embodiment, the non-magnetic sheet SH1*a*_1 preferably is also added to detach the line conductors 14*a* from the bottom surface of the magnetic sheet SH2*a*.

Figure 17:
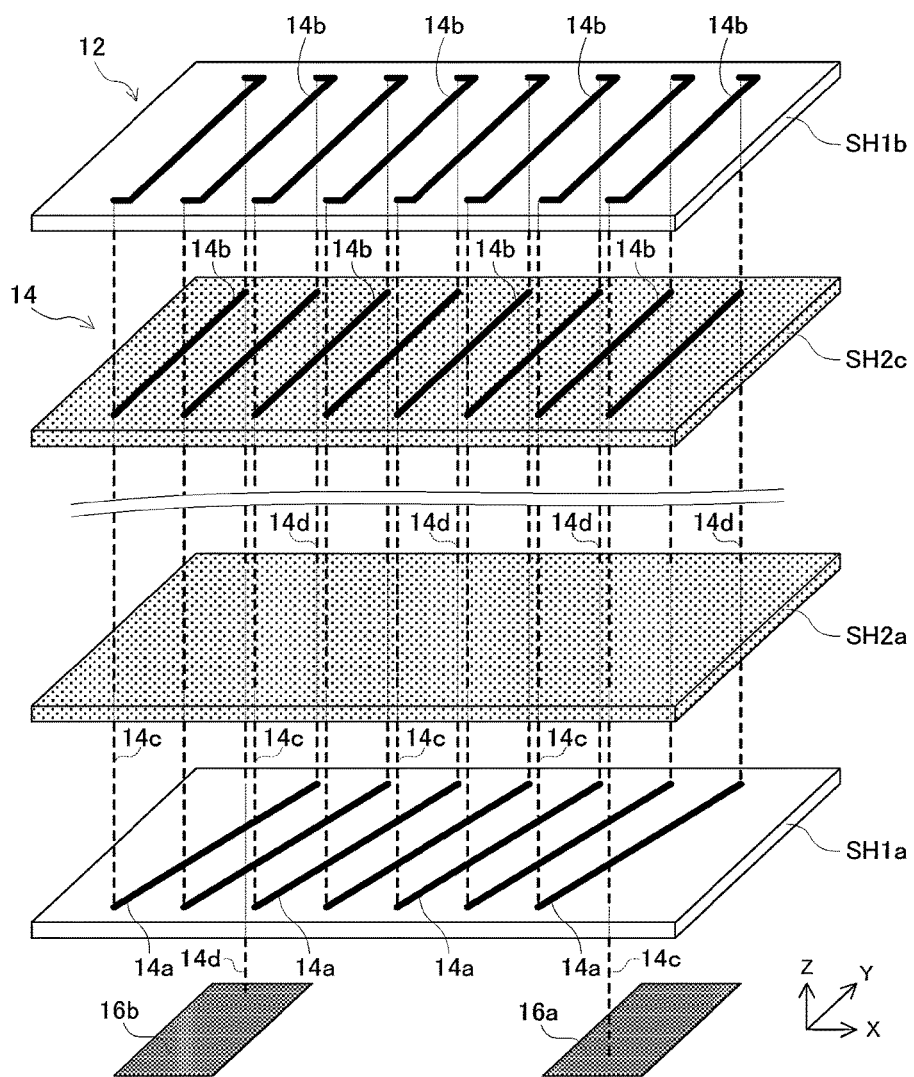
FIG. 17 is a schematic view illustrating a breakdown of a coil antenna device according to another preferred embodiment of the present invention.
Figure 18:
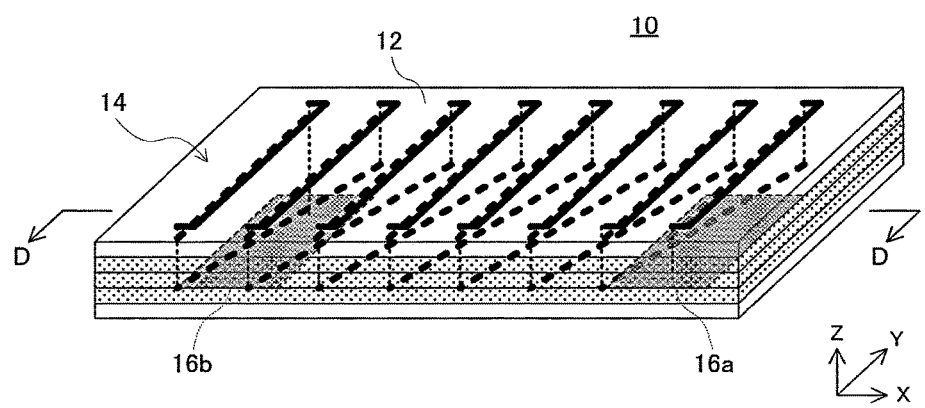
FIG. 18 is a perspective view illustrating an exterior appearance of the coil antenna device illustrated in FIG. 17.
Figure 19:
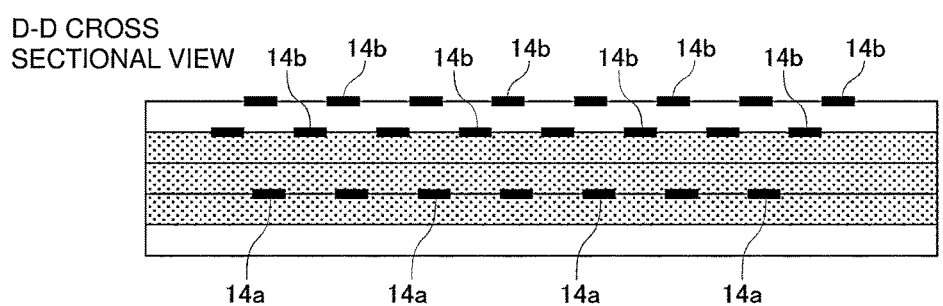
FIG. 19 is a cross-sectional view of the coil antenna device illustrated in FIG. 18 taken along line D-D.

Referring to FIG. 17 and FIG. 18, in a coil antenna device 10 according to still another preferred embodiment, the line conductors 14*b* located on the non-magnetic sheet SH1*b* and the line conductors 14*b* located on the magnetic sheet SH2*c* are arranged such that they do not overlap each other when they are viewed from the Z axis direction. Thus, the D-D cross section of the multilayer structure 12 is configured as illustrated in FIG. 19. The asperity formed on the top surface of the multilayer structure 12 due to thicknesses of the line conductors 14*b* is significantly reduced or prevented by arranging the line conductor 14*b* on the top surface of the non-magnetic sheet SH1*b* and the line conductor 14*b* on the top surface of the magnetic sheet SH2*c* such that they appear to be alternately disposed when viewed from the Z axis direction.

In the present preferred embodiment, the line width of the line conductors 14*b* located on the top surface of the non-magnetic sheet SH1*b* is equal or substantially equal to the line width of the line conductors 14*b* located on the top surface of the magnetic sheet SH2*c*. Alternatively, the line width of the line conductors 14*b* located on the top surface of the non-magnetic sheet SH1*b* is wider than the line width of the line conductors 14*b* located on the top surface of the magnetic sheet SH2*c*.

Further, in the present preferred embodiment, the non-magnetic sheet SH1*a*_1 preferably is also added to detach the line conductors 14*a* from the bottom surface of the magnetic sheet SH2*a*.

Figure 20:
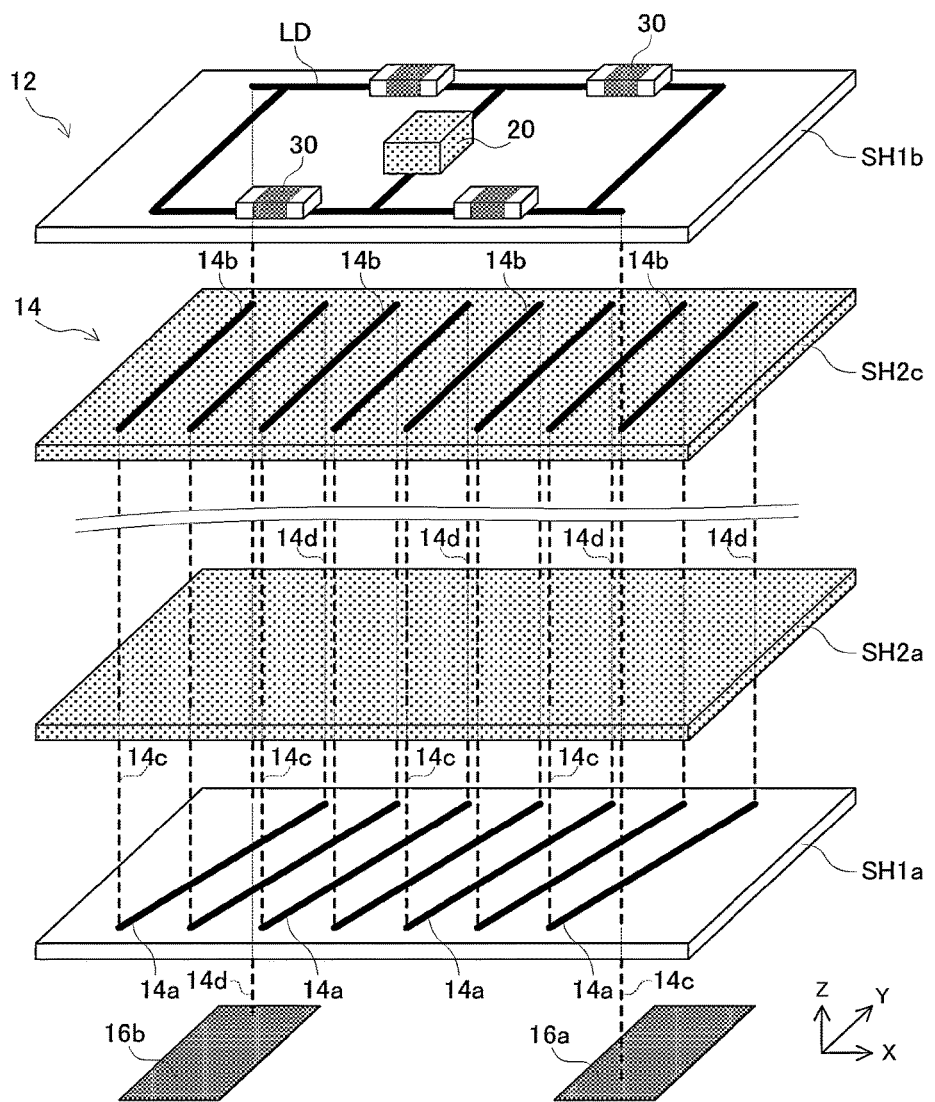
FIG. 20 is a schematic view illustrating a breakdown of a coil antenna device according to another preferred embodiment of the present invention.

Referring to FIG. 20, a coil antenna device 10 according to another preferred embodiment is similar to the antenna coil device 10 illustrated in FIG. 1 except that the RFIC device 20, a plurality of the passive devices 30, and the wiring conductor LD that connects these devices to each other are mounted on the non-magnetic sheet SH1*b*, and that the via-hole conductors 14*c* and 14*d* that define two end portions of the coil conductor 14 penetrate the non-magnetic sheet SH1*b* and are connected to the wiring conductor LD. This makes it possible to achieve space-saving and reduce the conductor loss by reducing the length of the wiring conductor LD.

In the present preferred embodiment, the non-magnetic sheet SH1*a*_1 preferably is also added to detach the line conductors 14*a* from the bottom surface of the magnetic sheet SH2*a*.

Figure 21:
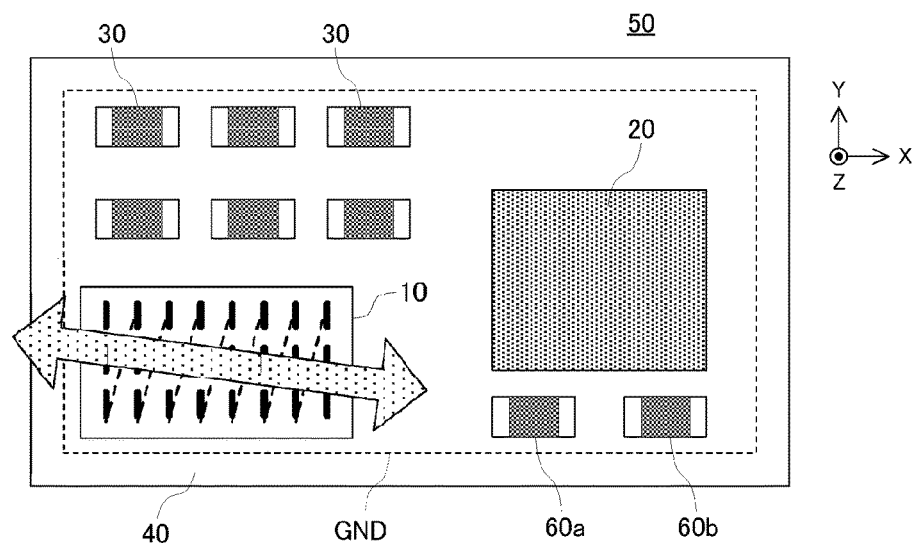
FIG. 21 is a plan view illustrating an antenna module according to another preferred embodiment of the present invention.

Referring to FIG. 21, in another preferred embodiment, two additional inductance devices 60*a* and 60*b* are mounted on the printed wiring board 40. Mounting positions are near an edge portion of the printed wiring board 40 and intersect with the coil axis of the coil conductor 14. Further, one end of the inductance device 60*a* is connected to one end of the antenna coil device 10, and one end of the inductance device 60*b* is connected to the other end of the antenna coil device 10.

Figure 22:
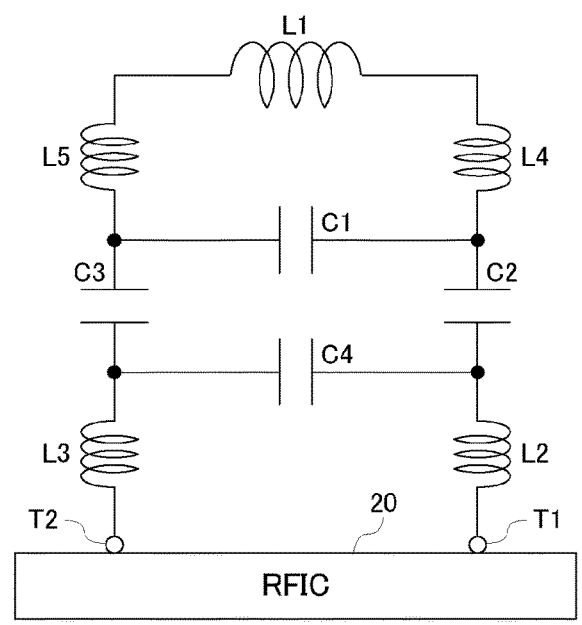
FIG. 22 is an equivalent circuit diagram illustrating a configuration of the antenna module illustrated in FIG. 21.

An equivalent circuit of the antenna module 50 that is fabricated as described above is configured as illustrated in FIG. 22. As illustrated in FIG. 22, one end of the inductor L1 is connected to one end of the capacitor C2 through an inductor L4, and the other end of the inductor L1 is connected to one end of the capacitor C3 through an inductor L5. Further, one end of the capacitor C1 is connected to a connecting point of the inductor L4 and the capacitor C2, and the other end of the capacitor C1 is connected to a connecting point of the inductor L5 and the capacitor C3.

Accordingly, it becomes possible to increase the total inductance value of the antenna module 50 by connecting the inductance devices 60a and 60b to the coil antenna device 40. Further, the coil antenna device 50 and the inductance devices 60a, 60b preferably are all arranged in the vicinity of the edge portion of the printed wiring board 40. This makes it possible to improve the antenna characteristics as well as the inductance value.

In the present preferred embodiment, chip type inductance devices 60a and 60b are preferably mounted on the printed wiring board 40. Alternatively, plane electrode patterns such as meandering electrodes, helical electrodes, or the like may be provided on the printed wiring board 40 as the inductance devices.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A coil antenna device comprising:
    a multilayer structure including a magnetic layer; and
    a coil conductor arranged in the multilayer structure such that a portion of the magnetic layer defines a magnetic core and such that a coil axis extends along a principle surface of the multilayer structure; wherein
    the coil conductor includes a line conductor portion extending along the principle surface of the multilayer structure and a plurality of via-hole conductor portions extending in a thickness direction of the multilayer structure;
    at least a portion of the line conductor portion is disposed outside of the magnetic layer;
    the line conductor portion includes a plurality of first line conductors and a plurality of second line conductors, each of the plurality of first line conductors extending on one principle surface side of the magnetic layer, each of the plurality of second line conductors extending on another principle surface side of the magnetic layer;
    the plurality of via-hole conductors define a coiled structure together with the plurality of first line conductors and the plurality of second line conductors;
    all of the plurality of via-hole conductor portions extending in the thickness direction of the multilayer structure that connect the plurality of first line conductors with the plurality of second line conductors are surrounded by the magnetic layer;
    the coil antenna device is used in HF-band frequency;
    the multilayer structure further includes a first low magnetic permeability layer that has a magnetic permeability lower than that of the magnetic layer, that is stacked on one principle surface side of the magnetic layer, and that supports at least one of the plurality of first line conductors at a position spaced from the magnetic layer;
    each of the plurality of first line conductors includes a plurality of first partial line conductors that are connected in parallel to each other with via-hole conductor portions of the plurality of via-hole conductor portions; and
    at least one of the plurality of first partial line conductors is supported by the first low magnetic permeability layer.

2. The coil antenna device according to claim 1, wherein each of the plurality of first partial line conductors has a line width that becomes wider as a distance from the magnetic layer increases.

3. The coil antenna device according to claim 1, wherein the plurality of first partial line conductors is arranged such that the respective first partial line conductors are disposed at positions different from each other when viewed from a stacking direction.

4. The coil antenna device according to claim 1, wherein
    each of the plurality of first line conductors extends in a first direction, the first direction intersecting with a predetermined side surface at a first angle, the predetermined side surface being one of a plurality of side surfaces that define the multilayer structure and intersecting with the coil axis; and
    each of the plurality of second line conductors extends in a second direction, the second direction intersecting with the predetermined side surface at a second angle, the second angle being larger than the first angle.

5. The coil antenna device according to claim 4, further comprising:
    a plurality of terminals that is provided on the another principle surface side of the magnetic layer and respectively connected to both end portions of the coil conductor; and
    two of the plurality of first line conductors define the two end portions of the coil conductor.

6. The coil antenna device according to claim 1, wherein
    the multilayer structure further includes a mounting layer that is stacked on one principle surface side of the magnetic layer and on which a wireless communication device that operates jointly with the coil conductor is mounted; and
    the wireless communication device is connected to the coil conductor by a via-hole conductor portion of the plurality of via-hole conductor portions.

7. A coil antenna device comprising:
    a multilayer structure including a magnetic layer; and
    a coil conductor arranged in the multilayer structure such that a portion of the magnetic layer defines a magnetic core and such that a coil axis extends along a principle surface of the multilayer structure; wherein
    the coil conductor includes a line conductor portion extending along the principle surface of the multilayer structure and a plurality of via-hole conductor portions extending in a thickness direction of the multilayer structure;
    at least a portion of the line conductor portion is disposed outside of the magnetic layer;
    the line conductor portion includes a plurality of first line conductors and a plurality of second line conductors, each of the plurality of first line conductors extending on one principle surface side of the magnetic layer, each of the plurality of second line conductors extending on another principle surface side of the magnetic layer;
    the plurality of via-hole conductors define a coiled structure together with the plurality of first line conductors and the plurality of second line conductors;
    all of the plurality of via-hole conductor portions extending in the thickness direction of the multilayer structure that connect the plurality of first line conductors with the plurality of second line conductors are surrounded by the magnetic layer;

the coil antenna device is used in HF-band frequency;
the multilayer structure further includes a second low magnetic permeability layer that has a magnetic permeability lower than that of the magnetic layer, that is stacked on another principle surface side of the magnetic layer, and that supports at least one of the plurality of second line conductors at a position spaced from the magnetic layer;
each of the plurality of second line conductors includes a plurality of second partial line conductors that are connected in parallel to each other with via-hole conductor portions of the plurality of via-hole conductor portions; and
at least one of the plurality of second partial line conductors is supported by the second low magnetic permeability layer.

8. An antenna module comprising:
a printed wiring board;
a coil antenna device mounted on the printed wiring board;
a plurality of wireless communication devices that perform wireless communication and are mounted on the printed wiring board; wherein
the coil antenna device includes:
  a multilayer structure including a magnetic layer; and
  a coil conductor arranged in the multilayer structure such that a portion of the magnetic layer defines a magnetic core and such that a coil axis extends along a principle surface of the multilayer structure; wherein
  the coil conductor includes a line conductor portion extending along the principle surface of the multilayer structure and a plurality of via-hole conductor portions extending in a thickness direction of the multilayer structure;
  at least a portion of the line conductor portion is disposed outside of the magnetic layer;
  the line conductor portion includes a plurality of first line conductors and a plurality of second line conductors, each of the plurality of first line conductors extending on one principle surface side of the magnetic layer, each of the plurality of second line conductors extending on another principle surface side of the magnetic layer;
  the plurality of via-hole conductors define a coiled structure together with the plurality of first line conductors and the plurality of second line conductors;
  all of the plurality of via-hole conductor portions extending in the thickness direction of the multilayer structure that connect the plurality of first line conductors with the plurality of second line conductors are surrounded by the magnetic layer; and
  the coil antenna device is used in HF-band frequency;
at least a portion of the coil conductor is disposed outside of the magnetic core; and
the coil antenna device is mounted on a corner portion of the printed wiring board such that a coil axis of the coil conductor extends along a principle surface of the printed wiring board and intersects two straight sides that define the corner portion of the printed wiring board when seen in a plan view of the principal surface of the printed wiring board.

9. The antenna module according to claim 8, wherein
the coil antenna device further includes a mounting surface that is rectangular or substantially rectangular and opposes the principle surface of the printed wiring board; and
a longer side of the mounting surface and a shorter side of the mounting surface extend along the two straight sides that define the corner portion of the printed wiring board, respectively.

10. The antenna module according to claim 9, wherein
the plurality of first line conductors extend along the mounting surface and the plurality of second line conductors oppose the plurality of first line conductors;
when seen in a plan view of the mounting surface, each of the plurality of first line conductors extend in a first direction, the first direction intersecting with the longer side of the mounting surface at a first angle, and each of the plurality of second line conductors extend in a second direction intersecting with the longer side of the mounting surface at a second angle, the second angle being larger than the first angle.

11. The antenna module according to claim 8, further comprising at least one of an inductance device and a capacitance device, which is mounted on the printed wiring board so as not to intersect with the coil axis of the coil conductor.

12. The antenna module according to claim 8, further comprising an inductance device mounted on the printed wiring board so as to intersect with the coil axis of the coil conductor.

* * * * *